US009363925B2

(12) United States Patent
Czamara et al.

(10) Patent No.: US 9,363,925 B2
(45) Date of Patent: Jun. 7, 2016

(54) METHOD OF PROVIDING COMPUTING RESOURCES FOR A DATA CENTER

(71) Applicant: Amazon Technologies, Inc., Reno, NV (US)

(72) Inventors: Michael Phillip Czamara, Seattle, WA (US); Osvaldo P. Morales, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 71 days.

(21) Appl. No.: 13/833,895

(22) Filed: Mar. 15, 2013

(65) Prior Publication Data

US 2013/0199032 A1   Aug. 8, 2013

Related U.S. Application Data

(62) Division of application No. 12/568,323, filed on Sep. 28, 2009, now Pat. No. 9,101,080.

(51) Int. Cl.
*F25D 17/04* (2006.01)
*H05K 7/20* (2006.01)
(Continued)

(52) U.S. Cl.
CPC .............. *H05K 7/20736* (2013.01); *G06F 1/20* (2013.01); *G06F 1/206* (2013.01); *H05K 7/1488* (2013.01); *H05K 7/1497* (2013.01);
(Continued)

(58) Field of Classification Search
CPC .............. H01L 23/467; H05K 7/1497; H05K 7/20745; Y10T 29/49117; Y10T 29/49826; G06F 1/20; G06F 1/206

USPC .............. 62/186, 259.2, 259.4, 414, 418; 165/80.3, 104.33; 236/49.3; 361/690, 361/695, 696; 454/184
See application file for complete search history.

(56) References Cited

U.S. PATENT DOCUMENTS 6,034,873 A * 3/2000 St.ang.hl et al. .............. 361/701
6,141,986 A   11/2000 Koplin
(Continued)

FOREIGN PATENT DOCUMENTS

EP   2101017 A2 *  9/2009   ................ E04H 1/12
JP   5768100         4/1982
(Continued)

OTHER PUBLICATIONS

Office Action from Japanese Patent Application No. 2012-532222, dated Dec. 10, 2013, English and Japanese versions, pp. 1-4.
(Continued)

*Primary Examiner* — Marc Norman
*Assistant Examiner* — Paolo Gonzalez
(74) *Attorney, Agent, or Firm* — Robert C. Kowert; Meyertons, Hood, Kivlin, Kowert & Goetzel, P.C.

(57) ABSTRACT

A modular computing system for a data center includes one or more data center modules including rack-mounted computer systems. An electrical module is coupled to the data center modules and provides electrical power to computer systems in the data center modules. One or more air handling modules are coupled to the data center modules. The data center module may include two pre-fabricated portions, each portion including a row of racks of computer systems. The two computing module portions of the data center module may combine to form a computing space when coupled to one another.

20 Claims, 10 Drawing Sheets

(51) Int. Cl.
*H05K 7/14* (2006.01)
*G06F 1/20* (2006.01)

(52) U.S. Cl.
CPC ....... *H05K 7/20718* (2013.01); *H05K 7/20745* (2013.01); *H05K 7/20836* (2013.01); *Y10T 29/49117* (2015.01); *Y10T 29/49826* (2015.01)

(56) References Cited

U.S. PATENT DOCUMENTS

| | | | |
|---|---|---|---|
| 7,010,392 B2 | 3/2006 | Bash et al. | |
| 7,197,433 B2 | 3/2007 | Patel et al. | |
| 7,278,273 B1 | 10/2007 | Whitted et al. | |
| 7,430,118 B1* | 9/2008 | Noteboom et al. | 361/695 |
| 7,511,959 B2* | 3/2009 | Belady et al. | 361/701 |
| 7,701,714 B2* | 4/2010 | Shabany | 361/698 |
| 7,990,710 B2* | 8/2011 | Hellriegel et al. | 361/699 |
| 8,077,457 B2* | 12/2011 | Gauthier et al. | 361/690 |
| 8,141,374 B2 | 3/2012 | Hay | |
| 8,151,578 B1 | 4/2012 | Morales et al. | |
| 8,180,495 B1* | 5/2012 | Roy | 700/278 |
| 8,514,572 B2* | 8/2013 | Rogers | 361/695 |
| 2005/0228618 A1 | 10/2005 | Patel et al. | |
| 2006/0065000 A1 | 3/2006 | Belady | |
| 2007/0094946 A1* | 5/2007 | Schoeny et al. | 52/79.1 |
| 2007/0101746 A1 | 5/2007 | Schlom et al. | |
| 2007/0167125 A1 | 7/2007 | Rasmussen et al. | |
| 2007/0213000 A1 | 9/2007 | Day | |
| 2007/0274043 A1* | 11/2007 | Shabany | 361/696 |
| 2008/0029250 A1 | 2/2008 | Carlson et al. | |
| 2008/0055846 A1* | 3/2008 | Clidaras et al. | 361/687 |
| 2008/0055850 A1* | 3/2008 | Carlson et al. | 361/695 |
| 2008/0094797 A1 | 4/2008 | Coglitore et al. | |
| 2008/0158818 A1* | 7/2008 | Clidaras et al. | 361/699 |
| 2008/0259566 A1 | 10/2008 | Fried | |
| 2008/0270572 A1* | 10/2008 | Belady et al. | 709/218 |
| 2009/0046427 A1* | 2/2009 | Noteboom et al. | 361/695 |
| 2009/0168345 A1* | 7/2009 | Martini | 361/691 |
| 2009/0195977 A1 | 8/2009 | Fink et al. | |
| 2009/0207567 A1 | 8/2009 | Campbell et al. | |
| 2009/0210096 A1 | 8/2009 | Stack et al. | |
| 2009/0229194 A1* | 9/2009 | Armillas | 52/79.1 |
| 2009/0241578 A1* | 10/2009 | Carlson et al. | 62/259.2 |
| 2009/0301123 A1* | 12/2009 | Monk et al. | 62/259.2 |
| 2009/0326721 A1* | 12/2009 | Sugiyama et al. | 700/282 |
| 2010/0144265 A1* | 6/2010 | Bednarcik et al. | 454/184 |
| 2010/0188810 A1* | 7/2010 | Andersen et al. | 361/679.49 |
| 2010/0223085 A1* | 9/2010 | Gauthier et al. | 705/8 |
| 2010/0290197 A1* | 11/2010 | Bergthold et al. | 361/729 |

FOREIGN PATENT DOCUMENTS

| | | |
|---|---|---|
| JP | 2003314881 | 11/2003 |
| JP | 2007285082 | 11/2007 |
| WO | 2004083743 | 9/2009 |

OTHER PUBLICATIONS

International Search Report and Written Opinion in application No. 201201861-0 mailed May 28, 2013 pp. 1-12.
Search and Examination Report from patent application No. 2012018610, mailed Jun. 20, 2014, Amazon Technologies, Inc., pp. 1-5.
Office Action from Japanese Patent Application No. 2012-532222, mailed Nov. 27, 2012 (English Translation and Japanese Versions), pp. 1-6.
International Search Report from PCT/US 10/50408 mailed Jan. 26, 2011, pp. 1-9.
U.S. Appl. No. 11/956,849, filed Dec. 14, 2007, Osvaldo P. Morales.
U.S. Appl. No. 12/163,146, filed Jun. 27, 2008, Osvaldo P. Morales.
Office Action from Australian Application No. 2010297988, Dated Mar. 30, 2015, pp. 1-3.
Office Action from Japanese Application No. 2014-098587, Mailed Mar. 24, 2015 (English Translation and Japanese Versions), pp. 1-8.

* cited by examiner

METHOD OF PROVIDING COMPUTING RESOURCES FOR A DATA CENTER

This application is a Divisional of U.S. patent application Ser. No. 12/568,323, filed Sep. 28, 2009, which is hereby incorporated by reference in its entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carried out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems. Some known data centers include methods and apparatus that facilitate waste heat removal from a plurality of racking systems, typically by circulating air through one or more of the rack systems.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to effect. Substantial time and resources are typically required to design and build a data center (or expansion thereof), lay cables, install racks and cooling systems. Additional time and resources are typically needed to conduct inspections and obtain certifications and approvals, such as for electrical and HVAC systems.

One problem that may be encountered in a data center is a fire. In some data centers, a fire that starts in one part of the data center is likely to spread to other parts of the data center. For example, a fire that starts in an electrical transformer or switchgear in a data center may spread to the entire data center, knocking out all the servers in the data center. Thus, a fire may carry a high cost, both due to equipment replacement costs and down time/loss of computing resources.

Figure 1:
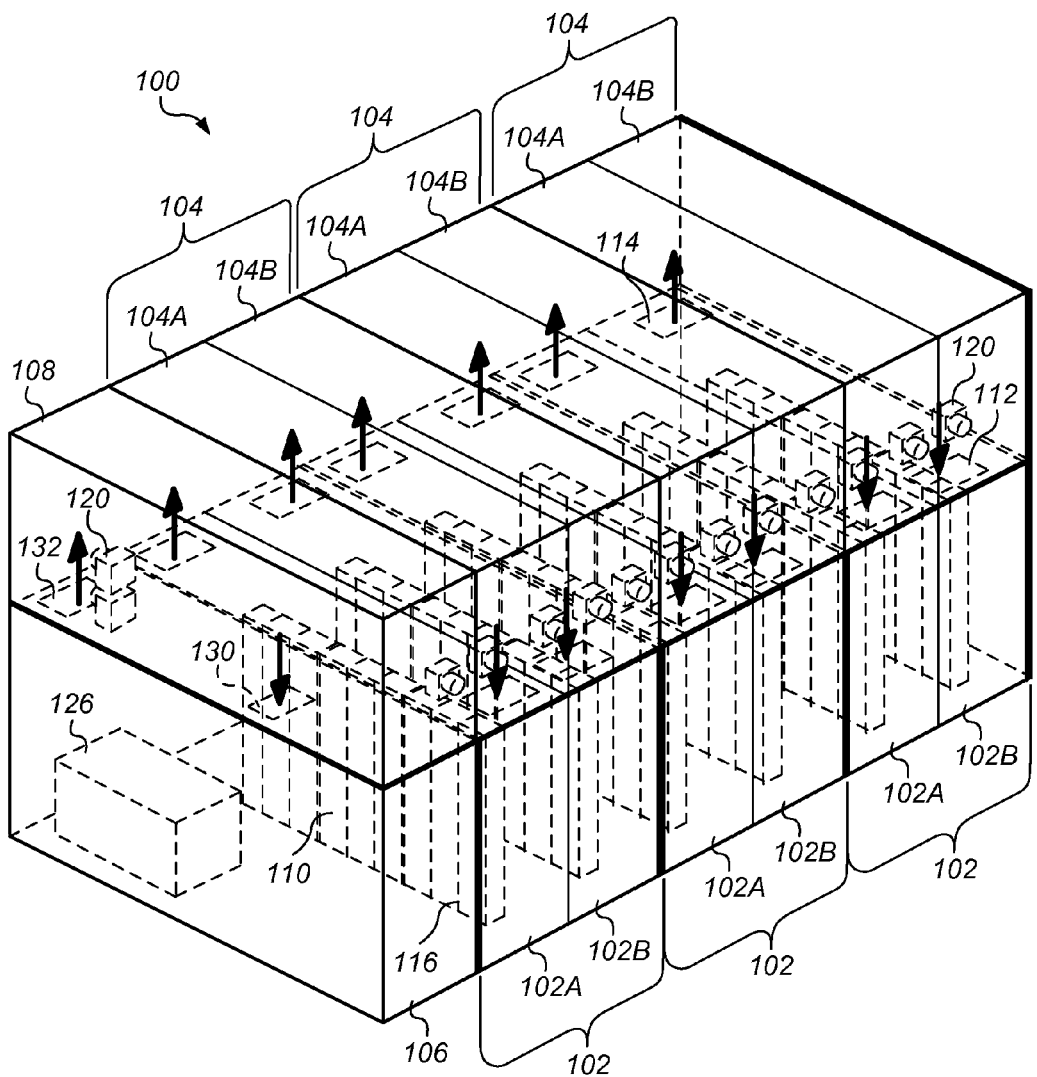
FIG. 1 illustrates one embodiment of a modular computing system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a modular system for a data center are disclosed. According to one embodiment, a modular computing system for a data center includes one or more data center modules having rack-mounted computer systems. An electrical module is coupled to the data center modules and provides electrical power to computer systems in the data center modules. One or more air handling modules are coupled to the data center modules. The air handling modules include at least one fan. The air handling modules provide air to at least one computer system in at least one of the data center modules. Modules of a system may be pre-fabricated prior to deliver to the data center site. In some embodiments, a modular computing system is a stand-alone, environmentally controlled computing system that requires only source electrical power and ambient air to operate.

According to one embodiment, a data center module includes a first data center module portion including a first row of racks of computer systems and a second data center module portion including a second row of racks of computer systems. The first computing module portion and the second computing module portion combine to form a computing space when coupled to one another. The modules may be pre-fabricated prior to deliver to the data center site.

According to one embodiment, a method of providing computing resources for a data center includes positioning one or more pre-fabricated data center modules at a site. The data center modules include rack-mounted computer systems. Pre-fabricated air handling modules including at least one fan are coupled to the data center modules. The air handling modules provide cooling air to computer systems in the data center modules. The pre-fabricated data center modules are operated at the site.

As used herein, "air handling module" means a module that provides air to one or more systems or components external to the module.

As used herein, an "aisle" means a space next to one or more racks.

As used herein, "ambient" refers to a condition of outside air at the location of a system or data center. An ambient temperature may be taken, for example, at or near an intake hood of an air handling system.

As used herein, "computing" includes any operations that can be performed by a computer, such as computation, data storage, data retrieval, or communications.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "computer room" means a room of a building in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center module" means a module that includes, or is suitable for housing and/or physically supporting, one or more computer systems that can provide computing resources for a data center.

As used herein, "electrical module" means a module that distributes electrical power to systems or components external to the electrical module.

As used herein, "evaporative cooling" means cooling of air by evaporation of liquid.

As used herein, "external cooling system" means a cooling system external to a modular computing system. For example, an external cooling system may be a chilled water system that is coupled to a modular computing system. An external cooling system may be located inside a facility or outdoors.

As used herein, a "free cooling" includes operation in which an air handling system pulls air at least partially from an external source (such as air outside a facility) and/or a return from a computer room, and forces the air to electronic equipment without active chilling in the air-handling sub-system (e.g., fluid flow through the chiller coils in the air handling sub-system is shut off by closing a flow control valve).

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, or container. In some embodiments, a module is pre-fabricated at a location off-site from a data center.

As used herein, "movable" means a component or combination or components having a container, housing, frame or other structure that allows the module to be moved as a unit from one location to another. For example, a movable module may be moved as a unit on a flatbed trailer. In some cases, a movable module may be attached to a portion of a floor, building, or permanent structure when deployed. For example, a movable module may be bolted to the floor of a data center facility.

As used herein, "power distribution unit" refers to any device, module, component, or combination thereof, that can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.)

As used herein, a "rack" means rack, container, frame, or other element or combination of elements that can contain or physically support one or more computer systems.

As used herein, "mechanical cooling" means cooling of air by a process that involves doing mechanical work on at least one fluid, such as occurs in vapor-compression refrigeration systems.

As used herein, "source power" includes power from any source, including but not limited to power received from a utility feed. In certain embodiments, "source power" may be received from the output of a transformer.

As used herein, a "space" means a space, area or volume.

FIG. 1 illustrates one embodiment of a modular computing system. Modular computing system 100 includes data center modules 102, air handling modules 104, electrical module 106, and air handling module 108. Air handling modules 104 may each provide cooling air to one of data center modules 102. Air handling module 108 may provide cooling air to electrical module 106.

Each of data center modules 102 includes half module 102A and half module 102B. Each half module includes a row 116 of server racks. Each row 116 of server racks may include several racks 110, each rack including several rack-mounted computer systems (for clarity, the computer systems are not shown in FIG. 1). In one embodiment, each half module accommodates a row of 10 racks, for a total of 20 racks per data center module. In one embodiment, a modular computing system is sized in 20-rack increments, to a maximum of 60 racks (three data center modules) per system. In one embodiment, the overall size of a modular computing system is about 63 feet×26 feet (excluding generator).

Electrical module 106 may provide electrical power to data center modules 102. Electrical conductors for distributing power from electrical module 106 to data center modules 102 may be provided in cables and/or buses running internal or external to the modules. In some embodiments, cables are provided through conduits or trays that run between the electrical module 106 and the various data center modules 102.

In the system illustrated in FIG. 1, three data center modules 102 are shown. In other embodiments, however, a modular computing system may include only one or two data center modules, or more than three data center modules. In a similar vein, an electrical module for a modular computing system may be sized to support less than three data center modules, or more than three data center modules.

Each of air handling modules 104 provides air to one of half modules 102A and one of half modules 102B. Each half module 102A and half module 102B includes supply air opening 112 for receiving cooling air from its respective air handling module 104. Each half module 102A and half module 102B includes return air opening 114 for discharging air back to the air handling module after the air has passed through server racks 110.

In the embodiment illustrated in FIG. 1, one air handling module 104, including air handling half module 104A and air handling half module 104B, is provided for both half modules 102A and half modules 102B of data center module 102. Air handling half module 104A and air handling half module 104B may couple to form a common chamber. Air from fans 120 in air handling half module 104A may mix with air from fans 120 in air handling half module 104B. The mixed air from the air handling half module 104A and 104B may be supplied to data center module 102, for example, via supply air openings 112 in half module 102A and half module 102B. In other embodiments, each of half module 102A and 102B may receive air from a separate air handling module. In certain embodiments, an air handling module may be coupled to, and/or provide cooling air for, more than one data center module.

In one embodiment, an air handling unit for a data center module is formed by combining two halves. For example, an air handling unit for data center module 102 may be formed from two halves, in which each air handling module half corresponds to one half modules 102A and 102B.

In some embodiments, each of half module 102A, half module 102B, air handling half module 104A, air handling half module 104B, electrical module 106, and air handling module 108 are prefabricated modules. Each of half modules 102A, half modules 102B, air handling half module 104A, air handling half module 104B, electrical module 106, and air handling module 108 may be separately transported to a site. For example, each of the modules or half modules may be transportable on a semi trailer. At the site, half modules 102A and half module 102B are coupled to form a data center module 102. When half modules 102A and 102B are fully coupled to form data center module 102, data center module 102 may become a sealed module.

Figure 2:
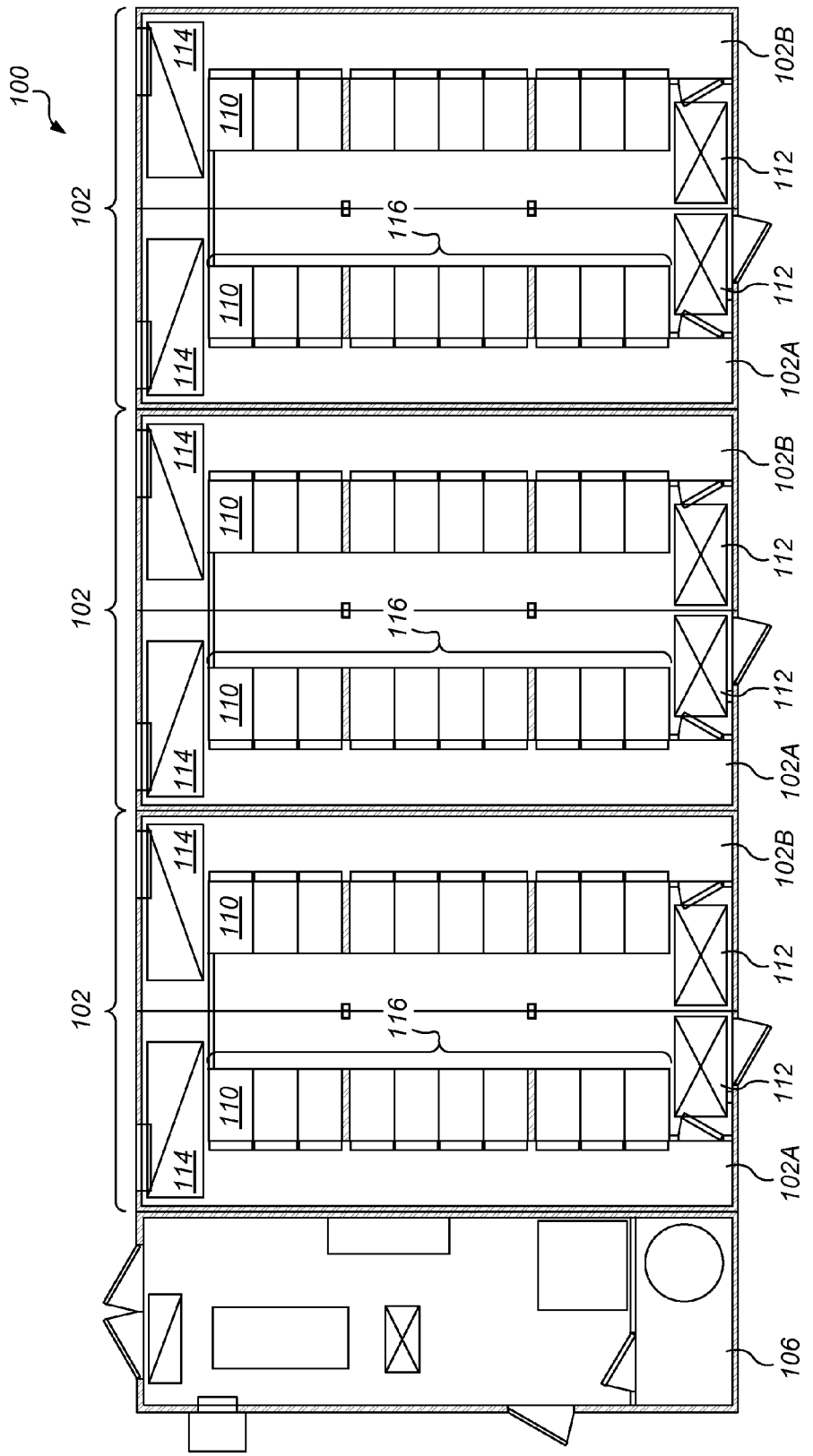
FIG. 2 is an overhead view of a lower level of one embodiment of a modular computing system.

FIG. 2 is an overhead view of a lower level of one embodiment of a modular computing system. Data center modules 102 and electrical module 106 of modular computing system 100 are positioned in line with one another. Each of half modules 102A and 102B of data center modules 102 includes row 116 including racks 110. In the embodiment shown in FIG. 2, each of rows 116 includes 10 racks 110. Row 114 may include any number of racks, however. In certain embodiments, each half module may include more than one row of racks. Air may be supplied from one of handling modules 104 to data center module 102 through supply air openings 112. Air may be returned to an air handling module from data center module 102 through return air openings 114. In certain embodiments, air discharged from racks 110 may be vented to ambient air.

Figure 3:
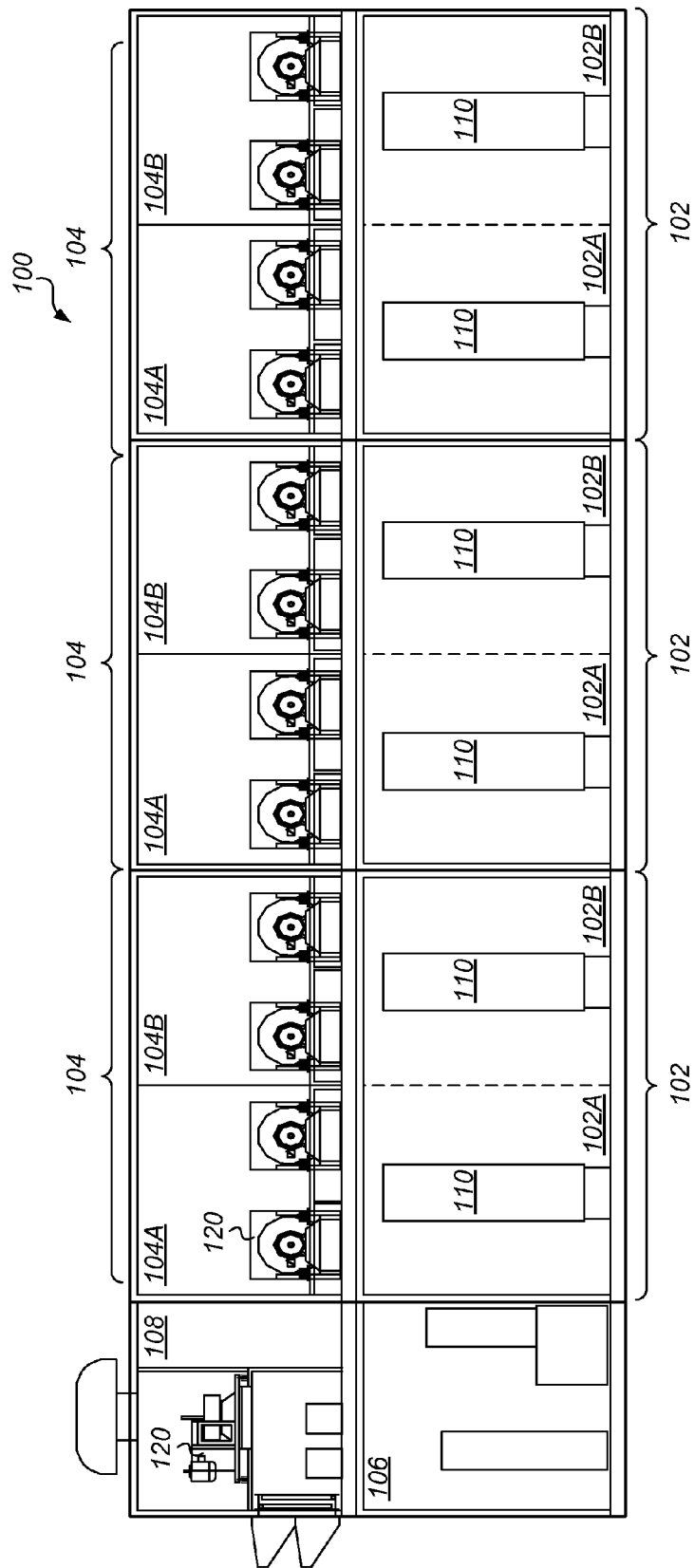
FIG. 3 is a side view of one embodiment of a modular computing system.

FIG. 3 is a side view of one embodiment of a modular computing system. Data center modules 102 and electrical module 106 form a lower level of modular computing system 100. Air handling modules 104 and air handling module 108 form an upper level of modular computing system 100. Air handling half module 104A and air handling half module 104B are mounted on half module 102A and half module 102B, respectively. Air handling module 108 is mounted on electrical module 106. Air handling modules 104 include fans 120. Fans 120 may be operated to circulate air in data center modules 102 and electrical module 106.

The number of data center modules deployed in a system may be selected based on the requirements of the data center. For example, if a data center in Facility A needs 38 server racks and Facility B needs 55 server racks, Facility A may be provided with two 20-rack data center modules (which could accommodate up to 40 racks total), and Facility B may be provided with three 20-rack data center modules (which could accommodate up to 60 racks total). In addition, over time, modules can be added to a modular computing system at a data center if the computing capacity needed at the facility increases, and modules can be removed from a modular computing system at the data center and redeployed if the computing capacity needed at the facility decreases.

Figure 4:
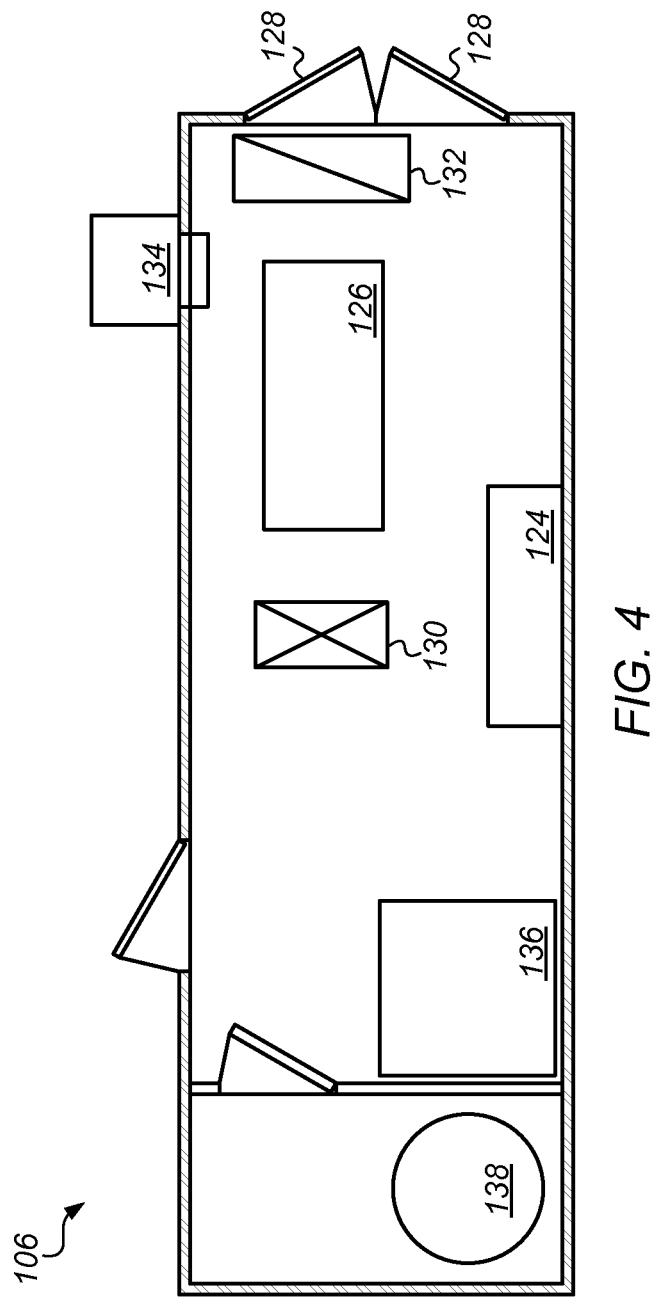
FIG. 4 is an overhead view illustrating an embodiment of an electrical module for a modular computing system.

FIG. 4 illustrates an embodiment of an electrical module. Electrical module 106 may be coupled to an external source of electrical power, such as a utility feed. Electrical module 106 may distribute electrical power to data center modules 102. Electrical module 106 includes switchgear/mechanical distribution panel 124 and uninterruptible power supply (UPS) 126. Although only one UPS is shown in FIG. 4, an electrical module may in some embodiments have more than UPS (for example, 5 UPSs). In certain embodiments, an electrical module for a module computing system may have no UPS. Service access to the components of electrical module may be through electrical module access doors 128.

Electrical module 106 may house all of the electrical gear associated with the modular computing system. In one embodiment, electrical module 106 includes a 1600 amp ATS, 2 UPSs at 550 kW each, a critical distribution panel, main distribution panels, and a mechanical distribution panel. In some embodiments, electrical power at 480/277Y voltage is distributed to racks in data center modules.

Cooling air for components of electrical module 106, including but not limited to uninterruptible power supply 126, may be provided by air handling module 108 (see FIGS. 1 and 2). Electrical module 106 includes electrical module supply air opening 130, electrical module return air opening 132, and exit air outlet 134.

Electrical module 106 includes fire suppression system 136. Fire suppression system provides fire suppression for electrical module 106. In some embodiments, fire suppression system is automated. In one embodiment, fire suppression system 136 includes an FM-200 fire suppression unit. In certain embodiments, fire suppression system 136 is coupled to a control system for a data center. In one embodiment, fire suppression system controls dampers on supply air opening 130, return air opening 132, and exit air outlet 134. Fire suppression system 136 may automatically close the dampers if a fire is detected in electrical module 106.

Electrical module 106 includes backup cooling system 138. In one embodiment, backup cooling system 138 includes an evaporative cooling system.

Figure 5:
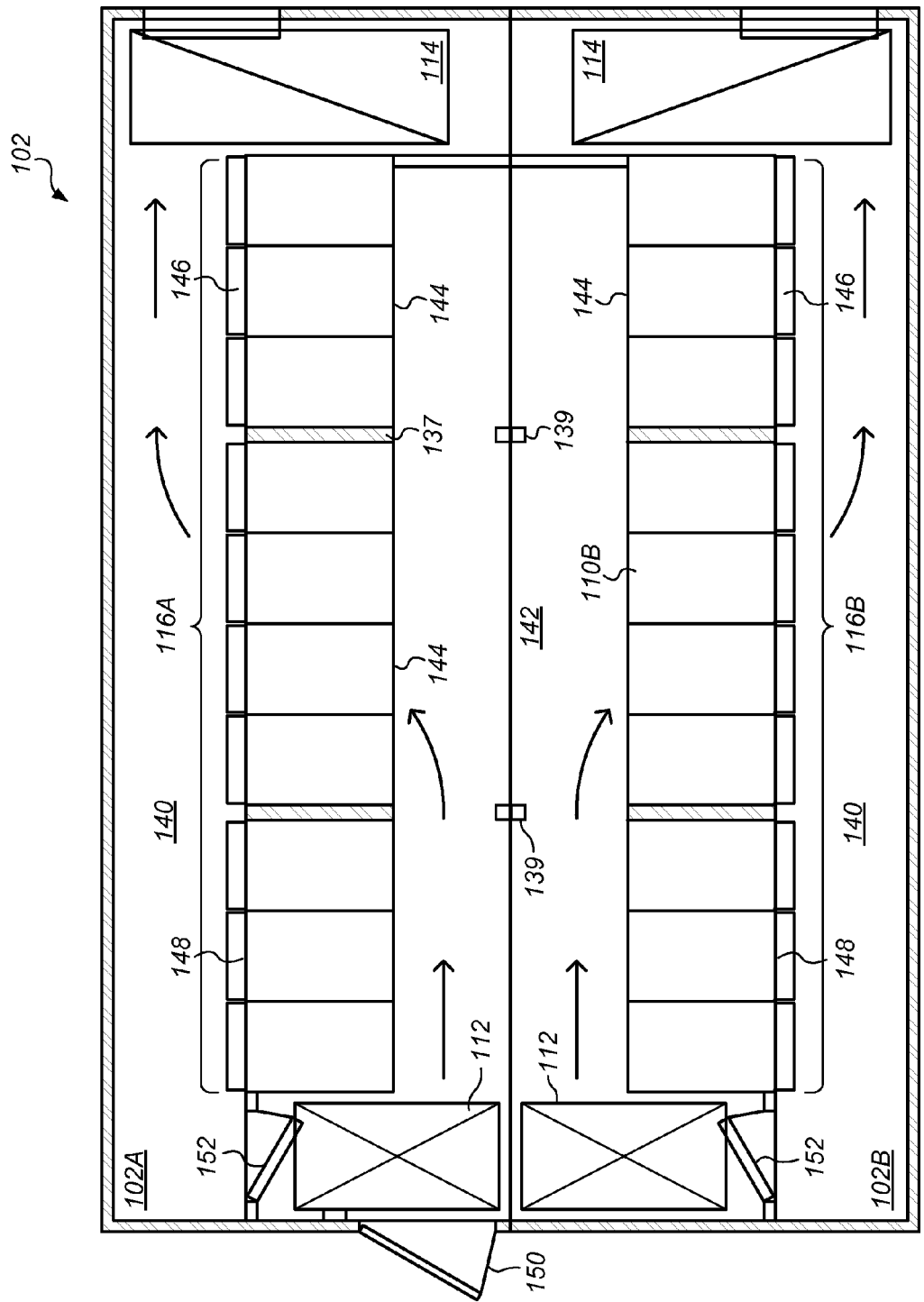
FIG. 5 is an overhead view illustrating an embodiment of a data center module for a modular computing system.

FIG. 5 illustrates an embodiment of a data center module for a modular computing system. Data center module 102 includes half module 102A and half module 102B. Half modules 102A and half modules 102B may be coupled together on site. Support columns 139 are provided at the junction of half module 102A and half module 102B. Half module 102A includes row 116A of server racks 110A. Half module 102B includes row 116B of server racks 110B. Rear aisle 140 is behind row 116A. Rear aisles 140 are provided in the space behind row 116A of server racks 110A and in the space behind row 116B of server racks 110B. The coupling of half modules 102A and half modules 102B forms joint aisle 142 between row 116A and row 116B. Support columns 137 may be provided between racks.

During operation of modular computing system 100, air handling module 104 (shown in FIG. 1) may supply air to data center module 102 through supply openings 112. Air may flow from supply openings 112 into joint aisle 142. Air from joint aisle 142 may pass through front 144 of server racks 110A and server racks 110B, pass over computer systems in server racks 110A and server racks 110B, and then exit the server racks through exit air devices 146 on back 148 of server racks 110A and server racks 110B. In some embodiments, exit air from various server racks 110A mixes in rear aisles 140. Air from rear aisles 140 may be drawn into air handling module through return opening 114. In certain embodiments, an exit air device 146 isolates air exiting from one of server racks 110A or server racks 110B from the air in rear aisles 140. For example, air from one of server racks 110A or server racks 110B may be ducted directly to air handling module 104 or vented directly to ambient air. In certain embodiments, exit air device 146 includes louvers.

Service access to the front of servers rack 110A and server rack 110B may be through data center module access door 150. Service access to the back of servers rack 110A and server rack 110B may be through rack access doors 152. In certain embodiments, rack access doors may be provided at both ends of the rack rows. For example, access doors could be provided under each of return air openings 114.

In one embodiment, each half module 102A and half module 102B is not more than 9 feet wide×26 feet long×9 feet high. Each module may have the ability to house 10 racks in a hot row, cold row containment arrangement. In this example, the data center module has a capacity of 20 racks. In one embodiment, each rack is a standard size rack, which can either be straight from the vendor or built on site. In one embodiment, a rack is 24 inch by 40 inch by 70 inch rack, such as may be available from Rittal. Each data center module may have three points of egress, one per hot row and a third for the joint cold row.

In an embodiment, a data center module includes a 10 kW rack with a nominal usage range of 7.5-9.0 kW. The ambient temperature inside the data center module may be raised to 95 degrees Fahrenheit at the intake side of the rack. In one embodiment, the maximum load for the data center modules, electrical module, and air handling modules does not exceed 1 MW.

In the embodiment illustrated in FIG. 5, the form and fit of half module 102A and half module 102B are depicted as mirror images of one another. For example, supply air opening 112 of half module 102A mirrors supply air opening 112 relative to the dividing line between half module 102A and half module 102B, and return air opening 114 of half module 102A mirrors return air opening 114 relative to the dividing line between half module 102A and half module 102B (each of return air openings 114 being farther from the dividing line than supply air openings 112). In other embodiments, the form and fit of both halves of a data center module may be the same, such that one configuration of the half module can be used interchangeably in either position (that is, on either the left or right side). In one embodiment, supply air opening 112 is the same size and spacing as return air opening 114, with suitable adapter plates and/or ducting provided in air handling modules to route air for insertion and removal at the appropriate locations in the data center module (for example, such that air is supplied to joint aisle 142 and removed from rear aisles 140 as described above).

Figure 6:
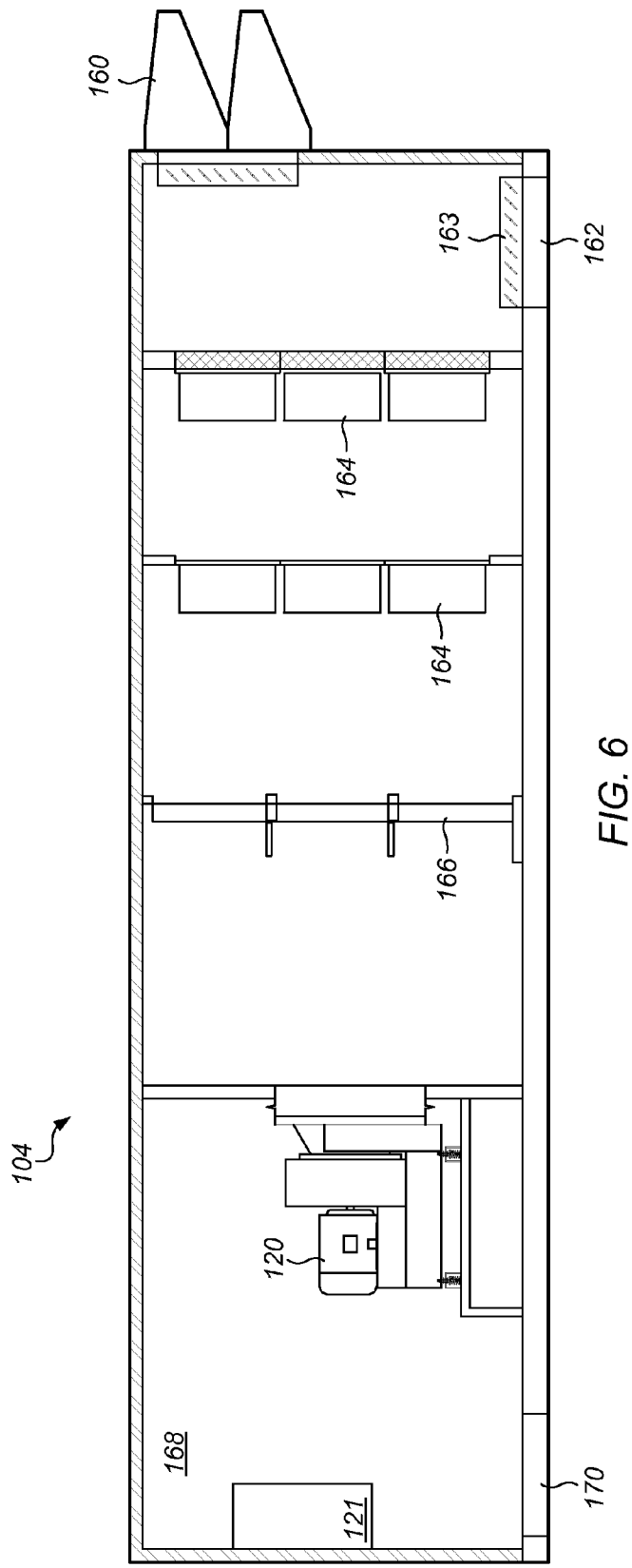
FIG. 6 is a side view illustrating an embodiment of an air handling module for cooling a data center module of a modular computing system.

FIG. 6 illustrates an embodiment of an air handling module for cooling a data center module. Air handling module 104 includes fans 120, VFDs 121, outside air vents 160, return air vents 162, return air damper 163, filters 164, and coil 166. VFDS 121 may be coupled to fans 120. VFDs 121 may be coupled to a control system for use in controlling fans 120. In one embodiment, each air handling module 104 includes a single motor fan. The roofs on air handling modules 104 may have a slight slant to prevent water from standing on them. As illustrated in FIG. 3, each half module 104A or 104B may have two fans positioned alongside one another. An air handling module or half module may, however, have any number or configurations of fans.

During operation of a modular computing system, fans 120 draw air from outside air vents 160, return air vents 162, or a combination thereof and through filters 164, and force the air into chamber 168. Air flows from chamber 168 through supply vent 170. Air from supply vent may pass into a data center module coupled to air handling module 104. In one embodiment, coil 166 is coupled to a chilled water loop. Chilled water passing through coil 166 may cool air before it enters the data center module. In another embodiment, coil 166 is coupled to a tap water supply. In certain embodiments, air handling module 104 may include, or be coupled to, a mechanical cooling system and/or an evaporative cooling system.

Figure 7:
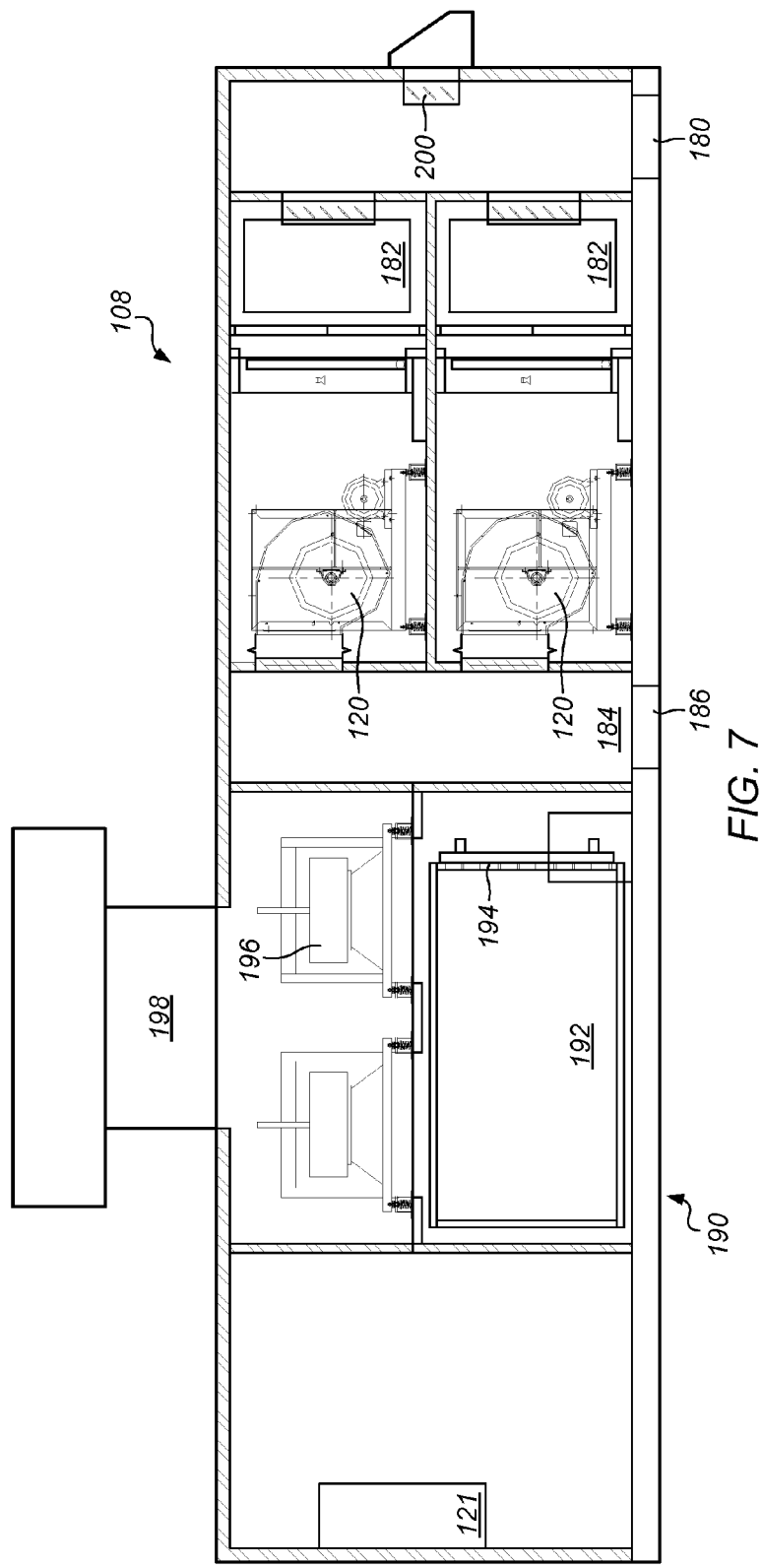
FIG. 7 is a side view illustrating an embodiment of an air handling module for cooling an electrical module of a modular computing system.

FIG. 7 illustrates an embodiment of an air handling module for cooling an electrical module. Air handling module may be a construction that is generally similar to that of air handling modules 104. Fans 120 of air handling module 108 may draw air from return air duct 180, outside air vents 182, or a combination thereof, and force air into chamber 184, causing air to be supplied through supply air duct 186, in a manner similar to that described above relative to FIG. 6 for air handling module 104. Air handling module 108 also includes a mechanical cooling system 190. Mechanical cooling system 190 includes condensing unit 192. Condensing unit 192 includes coils 194 and fans 196. Condensing unit 192 may be operated on an as-needed basis to provide adequate cooling in electrical module 106 during various modes of operation. Condensor unit air exhaust may be vented through vent 198. Air handling module 108 includes minimum outside air intake damper 200.

In one embodiment, air handling module 108 includes 3 fans, 2 for mass air evacuation during the UPS charging cycle and a single fan to control basic module temperature.

Cooling components in air handling modules 104 and may be coupled to a control system. In some embodiments, a separate control system is provided for the electrical module and a separate control system is provided for each of the data center modules. Each control system may measure conditions such as temperature, pressure, flow rate, and humidity for the data center module, and adjust cooling system parameters for that data center module, such as fan speed, air source, mechanical cooling based on the measured conditions. In one embodiment, all of the air handling sub-systems and chilled-water sub-systems at a data center are controlled with a common control unit. In other embodiments, separate controllers are provided for each air handling sub-system and chilled water sub-systems, or for a subset of the air handling sub-systems and/or chilled water sub-systems. Devices in air handling sub-systems and chilled water sub-systems may be controlled automatically, manually, or a combination thereof.

In certain embodiments, a control system includes at least one programmable logic controller. The PLC may, among other things, open and close dampers in air handling modules based upon command signals from an operator to channel air flow through a data center module as necessary for the prevailing operational conditions. Alternatively, the PLC may modulate dampers between fully open and fully closed positions to modulate airflow.

Modular computing system 100 may include temperature measurement devices that, in one embodiment, are thermocouples. Alternatively, the temperature measurement devices include, but are not limited to, resistance temperature detectors (RTDs) and any device that facilitate cooling operation as described herein. For example, a chilled water thermocouple may be positioned within chilled water subsystem 138 to facilitate measuring a temperature of the chilled water upon discharge from a heat exchanger. In the one embodiment, such chilled water temperatures are controlled to within a desired temperature range or set point. Suitable set points or ranges may be, in some embodiments, between 5 degrees Celsius (° C.) and 28 degrees Celsius (° C.).

In various embodiments, operation of one or more air handling modules of a cooling system may be controlled in response to one or more conditions. For example, the controller may be programmed to switch the air source for an air-handling sub-system from return air to outside air when one or more predetermined conditions are met, such as temperature and humidity.

In some embodiments, air handling modules 104 and air handling module 108 operate only in free cooling mode, and no refrigerant cooling is used. In other embodiments, one or both of air handling modules 104 and air handling module 108 may operate in with refrigerant cooling, such as in locations with extreme humidity and heat. In some embodiments, air handling modules 104 and air handling module 108 may use evaporative cooling (either selectively or continuously during operation).

In some embodiments of a modular computing system, some or all of the modules may physically couple to one another. In certain embodiments, modules may be fastened together, such as by bolts or pins. In other embodiments, however, modules may not be fastened together, but simply be stacked or positioned next to one another. In some embodiments, adjoining modules may include aligning elements such as rails, pins, or keys. In certain embodiments, one or both of two adjoining modules, or two adjoining half modules, may include seal elements such that a seal is automatically made between the adjoining elements when they are coupled to one another.

In some embodiments, interface features of adjoining modules of a modular computing system are arranged such that electrical and/or cooling air connections are automatically made when the modules are coupled together. For example, when air handling module 104 shown in FIG. 6 is coupled to data center module 102 shown in FIG. 5, a supply air opening 170 in each of air handling half modules 104A and 104B may align a corresponding supply air opening 112 in one of data center half modules 102A and 102B, and a return air opening 162 in each of air handling half modules 104A and 104B may align with a corresponding return air opening 114 in one of data center half modules 102A and 102B. Similarly, when air handling module 108 shown in FIG. 7 is coupled to electrical module 106 shown in FIG. 4, supply air opening 186 of air handling module 108 may align with supply air opening 130 of electrical module 106, and return air opening 180 of air handling module 108 may align with return air opening 132 of electrical module 106. Thus, modular computing system 100 may be ready to operate as soon as air handling modules 104 are coupled to their respective data center modules 102, air handling module 108 is coupled to electrical module 106, and electrical connections made between electrical module 106 and data center modules 102, without the need to install interconnecting ducts, for example, between modules.

In some embodiments, modules of a modular computing system may be spaced from one another. Connections between modules may be made with suitable ducts, conduits, electrical cables, buses, etc.

Figure 8:
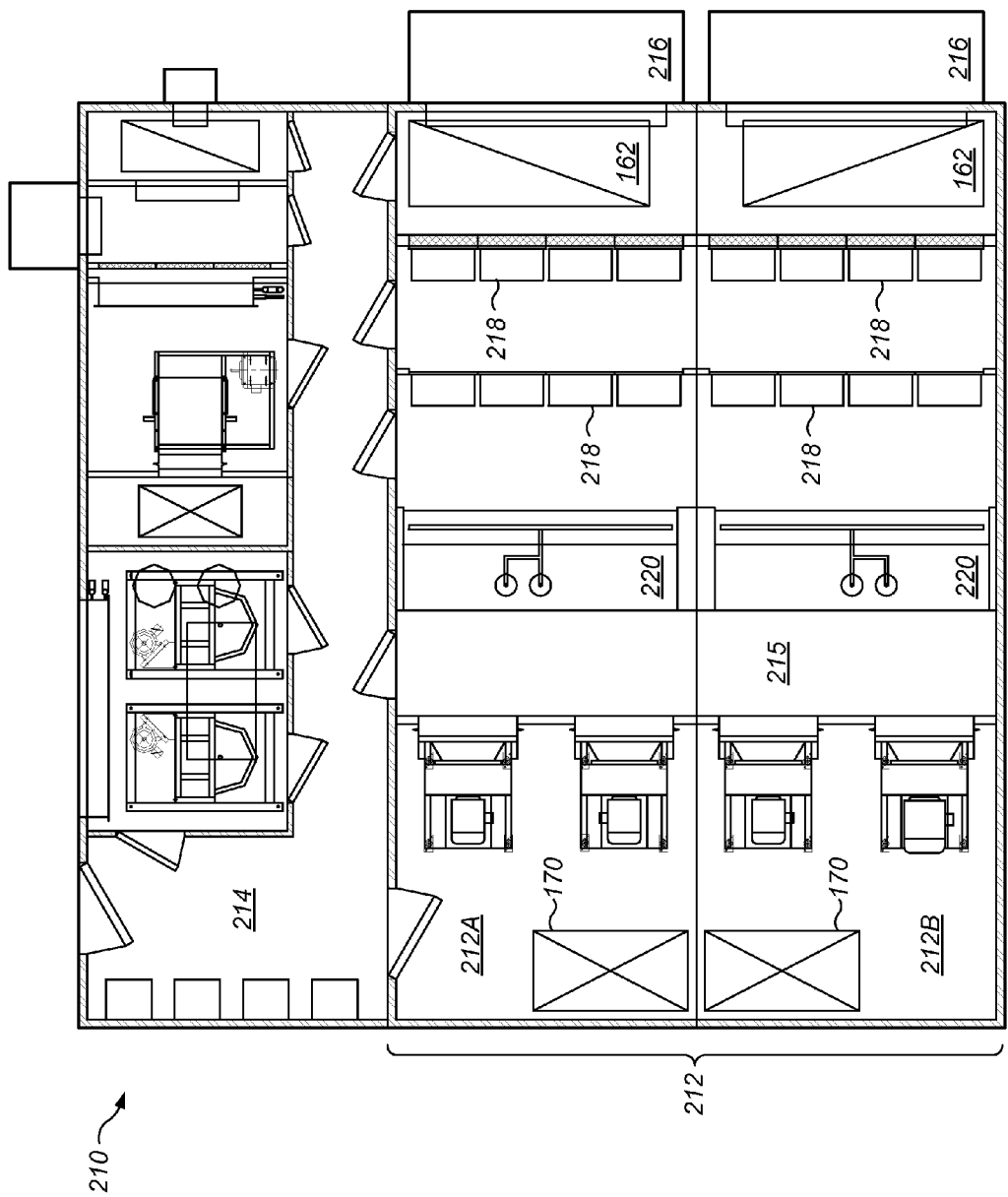
FIG. 8 is an overhead view illustrating an alternate embodiment of an upper level of a modular computing system including stand-alone evaporative cooling.

FIG. 8 is an overhead view illustrating an alternate embodiment of an upper level of a modular computing system including stand-alone evaporative cooling. Upper level 210 includes air handling module 212 and air handling module 214. Air handling module 212 may provide cooling air for a data center module of the modular computing system. Air handling module 214 may provide cooling air for an electrical module of the modular computing system. Air handling module 212 is formed from air handling half module 212A and air handling half module 212B. Air handling half module 212A and air handling half module 212B form common flow chamber 215. Fans 120 may draw air through return air opening 162, outside air opening 216, or a combination of both. Air may be drawn through filters 218 and evaporative cooling system 220, and then forced into data center module through supply air opening 170. In certain embodiments, a mechanical cooling system may be provided instead of, or in addition to, evaporative cooling system 220.

In some embodiments, each of data center modules 102 and electrical module 104 includes a Supervisory Control and Data Acquisition (SCADA) and/or Building Management System (BMS). In one embodiment, the system measures the temperature of the air and other mechanical systems (UPS, switchgear, for example) at a regular interval and self-adjusts. If the SCADA system cannot make the appropriate adjustments, the system will automatically page system personnel.

In an embodiment, electrical module and data center modules in a modular computing system each include their own fire suppression system. If a fire starts in one of the data center modules, or another catastrophic event occurs, or if any other problem condition is detected in the data center module, the control system in that data center module may shut down the data center module. Shutting down the module may include, but is not limited to, closing dampers on all airflow openings in the data module to extinguish a fire. The electrical module and the remaining data center modules in the modular computing system may continue to operate while the damage data center module is serviced, or removed and replaced. In certain embodiments, electrical module and data center modules may include FM-approved insulation. In certain embodiments, a module may be FM-approved.

In some embodiments, a modular computing system is positioned in situ as a certified piece of equipment (rather than a permanent dwelling, for example). In some embodiments, each module, prior to shipment to the site, may be pre-certified by a Nationally Recognized Testing Laboratory. In certain embodiments, modules may be UL-listed and/or ETLlisted. A modular computing system, or portions a modular computing system may be ETL SEMKO, CE/ETSI, or UL stamped. In some embodiments, having a certified unit will reduce the scope of a building inspection. For example, the electrical inspector may only inspect the cable connections between the transformer/generator and the external panel on electrical module 106, or the connections of any additional data center modules 102 added after the initial deployment. A modular computing system may thus in some embodiments be a self-contained system with the capability of rapid deploy, with only minor utility and fiber connections, which generally require only over-the-counter permits.

Figure 9:
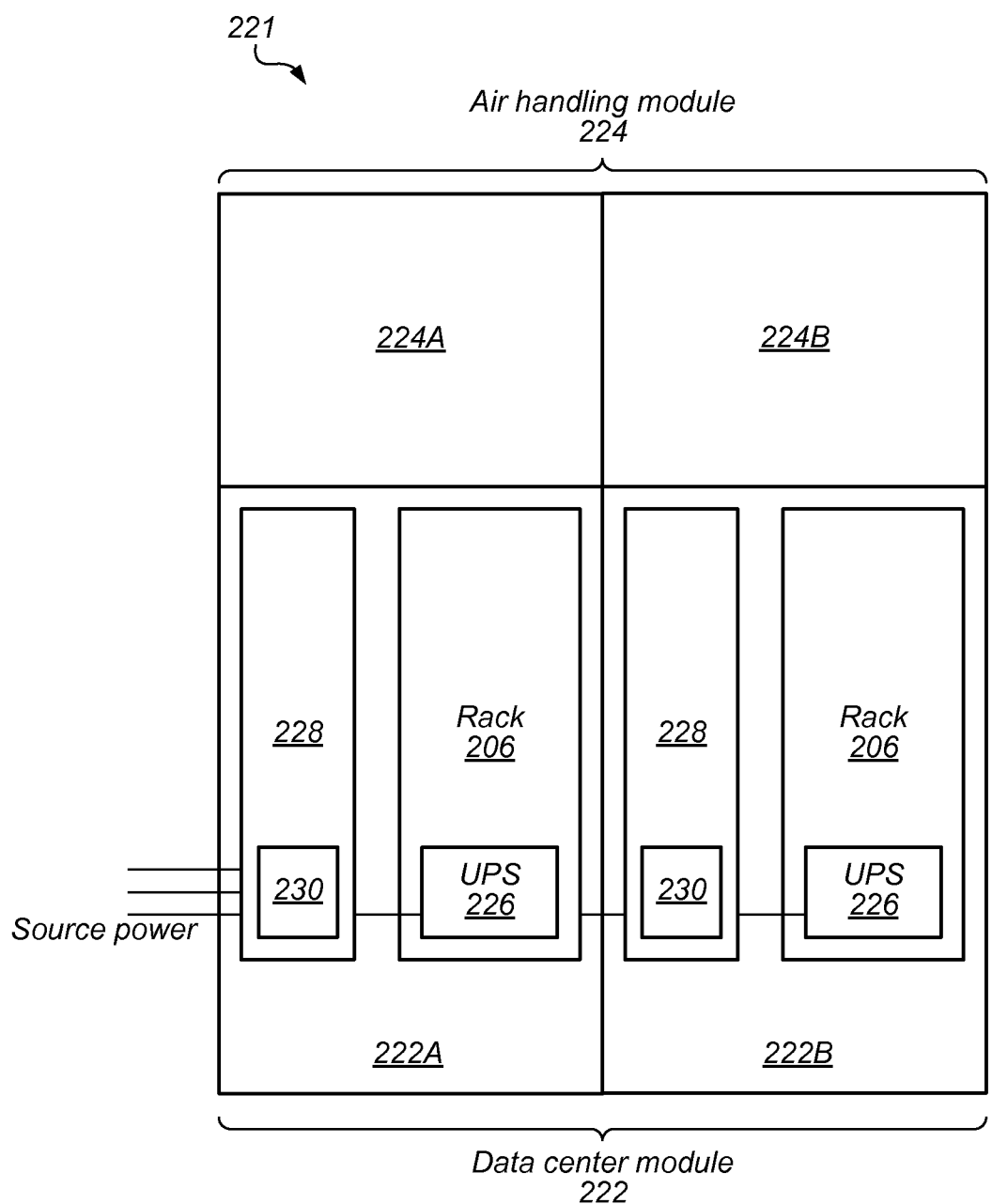
FIG. 9 is a schematic diagram illustrating one embodiment of a modular computing system data center module without a separate electrical module.

In some embodiments, some or all of the electrical components included in electrical module 106 described above with respect to (such as uninterruptible power supplies, switches) may be provided on board data center modules. FIG. 9 is a schematic diagram illustrating one embodiment of a modular computing system data center module without a separate electrical module. Modular computing system 221 includes data center module 222 and air handling module 224. Data center module 222 includes half module 222A and half module 222B. Each of half module 222A and half module 222B include rack-mounted UPS 226, and distribution panel 228. Distribution panel may include breaker 230. Data center module 222 may be electrically coupled to source power. In certain embodiments, a UPS is provided at a server-level. In certain embodiments, a UPS may be omitted altogether from a modular computing system.

In the embodiments illustrated in FIGS. 1, 2, and 3, data center modules 102 and electrical module 106 of modular computing system 100 are positioned in line with one another. In other embodiments, however, data center modules may be arranged in different ways with respect to the electrical module. For example, an electrical module may be sandwiched between two data center modules. As another example, an electrical module may be surrounded by three or more modules (on all four sides, or on the west, north, and east sides, for example). In certain embodiments, space may be provided between an electrical module and a data center module, or between two data center modules.

Figure 10:
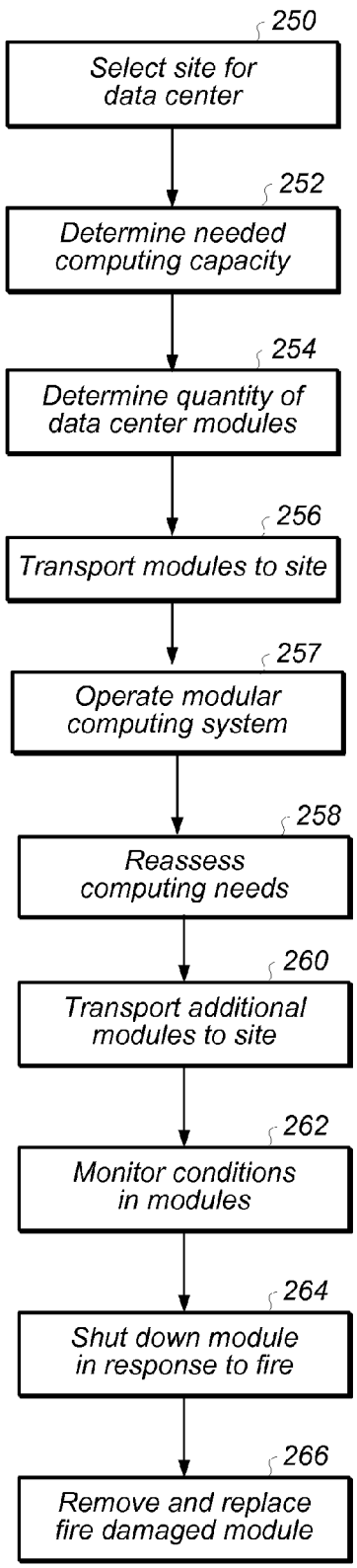
FIG. 10 illustrates one embodiment of providing computer resources with a modular computing system.

FIG. 10 illustrates one embodiment of providing computer resources including a modular computing system. At 250, a site for providing computing resources with a modular computing system is selected. In some embodiments, a site is an outdoor location. In other embodiments, a site is an indoor location, such as inside a warehouse.

At 252, computing capacity needed for a data center is determined. At 254, a quantity of data center modules for a computing system is determined from the required computing capacity.

At 256, modules are shipped to the site. The modules may include data center modules, electrical modules, and air handling modules. Each module or portion of a module (such as half module 102A) may be transported separately, such as on a semi trailer. In some embodiments, modules, or portions of modules, are pre-fabricated at one location, such as a factory, and transported to a data center site at another location. In certain embodiments, however, all or some portions of the modules for a computing system may be assembled at the data center site. For example, the two halves of data center modules may be coupled together at a site, racks may be installed in a data center module, or cooling systems, such as fans or evaporative coolers, may be installed in an air handling module. In some embodiments, the modules are pre-certified prior to shipment of the modules to the site. At 257, the modular computing system may be operated to provide computing services for a data center.

At 258, computing needs at a data center are reassessed. At 260, additional modules may be transported and installed at the site based on the reassessment. In some embodiments, one or more data center modules are added to an existing modular computing system.

At 262, conditions of data center modules and an electrical module in the modular computing system are monitored. At 264, one of data center modules is shut down in response to a warning of a fire in the data center module. At 266, a fire damaged data center module is removed and replaced. Data center modules other than the fire-damaged module may continue to operate while the fire damaged data center module is replaced.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method of providing computing resources for a data center, comprising:
   positioning one or more pre-fabricated data center modules at a site at the data center, the one or more pre-fabricated data center modules comprising:
      a row of racks comprising two or more rack-mounted computer systems,
      a cold aisle on one side of the row of racks that at least partially extends between opposite ends of the one or more pre-fabricated data center modules,
      a hot aisle on an other side of the row of racks that at least partially extends between the opposite ends of the one or more pre-fabricated data center modules,
      a module air inlet, at a particular end of the cold aisle that is proximate to a particular one of the opposite ends of the one or more pre-fabricated data center modules, that is configured to direct cooling air downwards into the one or more pre-fabricated data center modules and laterally down the cold aisle from the particular end of the cold aisle and along at least two racks in the row of racks, and
      a module air exit, at an opposite end of the hot aisle that is proximate to an opposite one of the opposite ends of the one or more pre-fabricated data center modules, that is configured to direct a laterally-oriented airflow upwards from the opposite end of the hot aisle and out of the one or more pre-fabricated data center modules;
   coupling one or more pre-fabricated air handling modules comprising at least one fan to at least one of the one or more pre-fabricated data center modules, wherein at least one of the one or more pre-fabricated air handling modules is configured to provide cooling air downwards into the particular end of the cold aisle through the module air inlet at the particular end of the cold aisle, laterally down the cold aisle, away from the particular end of the cold aisle and along at least two racks in the row of racks, laterally through computing systems in the two or more rack-mounted computer systems in the row of racks, laterally down the hot aisle along the two or more rack-mounted computer systems in the row of racks and away from the particular end of the cold aisle and towards the opposite end of the hot aisle, and upwards out of the module air exit at the opposite end of the hot aisle; and
   operating the at least one of the one or more pre-fabricated data center modules at the site, such that cooling air is provided downwards into the particular end of the cold aisle through the module air inlet at the particular end of the cold aisle, laterally down the cold aisle, away from the particular end of the cold aisle and along at least two racks in the row of racks, laterally through computing systems in the two or more rack-mounted computer systems in the row of racks, laterally down the hot aisle along the two or more rack-mounted computer systems in the row of racks and away from the particular end of the cold aisle and towards the opposite end of the hot aisle, and upwards out of the module air exit at the opposite end of the hot aisle.

2. The method of providing computing resources of claim 1, wherein operating the at least one of the one or more pre-fabricated data center modules at the site comprises running one or more fans in the at least one of the one or more pre-fabricated air handling modules to free-cool the at least one of the two or more rack-mounted computer systems in the at least one of the one or more pre-fabricated data center modules.

3. The method of providing computing resources of claim 1, wherein positioning the one or more pre-fabricated data center modules comprises:
    separately transporting a first data center module portion and a second data center module portion to the site; and
    coupling, at the site, the first data center module portion to the second data center module portion to form the one or more pre-fabricated data center modules.

4. The method of providing computing resources of claim 1, further comprising coupling one or more electrical modules to at least one of the one or more pre-fabricated data center modules, wherein at least one of the one or more electrical modules is configured to provide electrical power to at least one of the two or more rack-mounted computer systems in the one or more pre-fabricated data center modules.

5. The method of providing computing resources of claim 4, further comprising:
    positioning at least one additional pre-fabricated data center module at the site;
    coupling the at least one additional pre-fabricated data center module to the at least one of the one or more electrical modules at the site; and
    operating the at least one additional pre-fabricated data center module at the site.

6. The method of providing computing resources of claim 4, further comprising separately controlling cooling air for at least two of the one or more pre-fabricated data center modules and the at least one additional pre-fabricated data center module at the site.

7. The method of providing computing resources of claim 4, further comprising shutting down operation of one of the one or more pre-fabricated data center modules in operation at the site in response to a problem condition in the one of the one or more pre-fabricated data center modules while maintaining operation of at least one other of the one or more pre-fabricated data center modules at the site.

8. The method of providing computing resources of claim 7, further comprising replacing the one of the one or more pre-fabricated data center modules that has been shut down while maintaining operation of the at least one other of the one or more pre-fabricated data center modules at the site.

9. A method of providing computing resources for a data center, comprising:
    positioning one or more pre-fabricated data center modules at a site at the data center, the positioning comprising:
        separately transporting a first data center module portion and a second data center module portion to the site, wherein each of the first data center module portion and the second data center module portion comprise a separate open space; and
        laterally coupling, at the site, the first data center module portion to the second data center module portion, via laterally coupling respective sides of the first data center module portion and the second data center module portion, where each respective side bounds a side of the separate open space of the respective data center module portion, to form the one or more pre-fabricated data center modules, such that the one or more pre-fabricated data center modules comprises a sealed module configured to laterally supply air received into the sealed module to computer systems included in the sealed module and comprising:
            a first row of racks and a second row of racks extending in parallel with each other at a common elevation, wherein each row of racks comprises two or more rack-mounted computer systems, and
            a joint open space formed from a lateral combination of the separate open spaces of the first and second module portions, which extends laterally between the first row of racks and the second row of racks and is configured to laterally direct air received into the sealed module through the joint open space and out of the joint open space through the first row of racks and the second row of racks;
    coupling one or more pre-fabricated air handling modules comprising at least one fan to at least one of the one or more pre-fabricated data center modules, wherein at least one of the one or more pre-fabricated air handling modules is configured to provide cooling air to at least one computer system in at least one of the one or more pre-fabricated data center modules; and
    operating the at least one of the one or more pre-fabricated data center modules at the site, such that cooling air is provided downwards into a particular end of the one or more pre-fabricated data center modules through a module air inlet at a particular end of the joint open space, laterally down the joint open space, away from the particular end of the joint open space and along at least two racks in a row of racks of computer systems in the one or more pre-fabricated data center modules, laterally through computing systems in the two or more rack-mounted computer systems in the row of racks, laterally down a hot aisle along the two or more rack-mounted computer systems in the row of racks and away from the particular end of the joint open space, and upwards out of a particular end of the one or more pre-fabricated data center modules.

10. The method of providing computing resources of claim 9, wherein operating the at least one of the one or more pre-fabricated data center modules at the site comprises running one or more fans in the at least one of the one or more pre-fabricated air handling modules to free-cool the at least one computer systems in the at least one of the one or more pre-fabricated data center modules.

11. The method of providing computing resources of claim 9, wherein:
    the first data center module portion comprises a first row of racks of computer systems and an open space extending along one side of the first row of racks of computer systems;
    the second data center module portion comprises a second row of racks of computer systems and another open space extending along one side of the second row of racks of computer systems; and wherein laterally coupling, at the site, the first data center module portion to the second data center module portion to form the one or more pre-fabricated data center modules comprises laterally combining the open space of the first data center module portion and the other open space of the other second data center module portion to form the joint open space, such that the joint open space comprises a joint aisle laterally positioned between both of the first row of racks of the first data center module portion and the second row of racks of the second data center module portion.

12. The method of providing computing resources of claim 11, wherein at least one of the one or more pre-fabricated air handling modules is configured to supply air to the joint aisle, wherein at least one of the racks of the first row of racks is configured to receive air from the joint aisle and to exhaust air from the at least one rack of the first row of racks, and wherein at least one of the racks of the second row of racks is configured to receive air from the joint aisle and to exhaust air from the at least one rack of the second row of racks.

13. The method of providing computing resources of claim 9, further comprising coupling one or more electrical modules to at least one of the one or more pre-fabricated data center modules, wherein at least one of the one or more electrical modules is configured to provide electrical power to at least one of the computer systems in the one or more pre-fabricated data center modules.

14. The method of providing computing resources of claim 9, wherein the first data center module portion and the second data center module portion are pre-fabricated and interchangeable with one another.

15. The method of providing computing resources of claim 9, wherein:
the one or more pre-fabricated data center modules comprises:
a row of racks comprising two or more rack-mounted computer systems,
a cold aisle on one side of the row of racks,
a hot aisle on an other side of the row of racks,
a module air inlet at one end of the cold aisle, and
a module air exit at one end of the hot aisle; and
wherein at least one of the one or more pre-fabricated air handling modules is configured to provide cooling air from the module air inlet at the end of the cold aisle, down the cold aisle along at least two racks in the row of racks, through computing systems in the two or more rack-mounted computer system in the row of racks, down the hot aisle along the two or more rack-mounted computer systems in the row of racks, and out the module air exit at the end of the hot aisle.

16. A method of providing computing resources for a data center, comprising:
positioning one or more pre-fabricated data center modules at a site at the data center, the one or more pre-fabricated data center modules comprising:
a row of racks comprising two or more rack-mounted computer systems,
a cold aisle on one side of the row of racks that at least partially extends between opposite ends of the one or more pre-fabricated data center modules,
a hot aisle on an other side of the row of racks that at least partially extends between the opposite ends of the one or more pre-fabricated data center modules,
a module air inlet, at a particular end of the cold aisle that is proximate to a particular one of the opposite ends of the one or more pre-fabricated data center modules, that is configured to direct cooling air downwards into the one or more pre-fabricated data center modules and laterally down the cold aisle from the particular end of the cold aisle and along at least two racks in the row of racks, and
a module air exit, at an opposite end of the hot aisle that is proximate to an opposite one of the opposite ends of the one or more pre-fabricated data center modules, that is configured to direct a laterally-oriented airflow upwards from the opposite end of the hot aisle and out of the one or more pre-fabricated data center modules;
coupling one or more pre-fabricated air handling modules comprising at least one fan to at least one of the one or more pre-fabricated data center modules, wherein at least one of the one or more pre-fabricated air handling modules is configured to provide cooling air downwards into the particular end of the cold aisle through the module air inlet at the particular end of the cold aisle, laterally down the cold aisle, away from the particular end of the cold aisle and along at least two racks in the row of racks, laterally through computing systems in the two or more rack-mounted computer systems in the row of racks, laterally down the hot aisle along the two or more rack-mounted computer systems in the row of racks and away from the particular end of the cold aisle and towards the opposite end of the hot aisle, and upwards out of the module air exit at the opposite end of the hot aisle; and
running one or more fans in the at least one of the one or more pre-fabricated air handling modules to free-cool the at least one of the two or more rack-mounted computer systems in the at least one of the one or more pre-fabricated data center modules.

17. The method of providing computing resources of claim 16, further comprising coupling one or more electrical modules to at least one of the one or more pre-fabricated data center modules, wherein at least one of the one or more electrical modules is configured to provide electrical power to at least one of the two or more rack-mounted computer systems in the one or more pre-fabricated data center modules.

18. The method of providing computing resources of claim 17, further comprising:
positioning at least one additional pre-fabricated data center module at the site;
coupling the at least one additional pre-fabricated data center module to the at least one of the one or more electrical modules at the site; and
operating the at least one additional pre-fabricated data center module at the site.

19. The method of providing computing resources of claim 17, further comprising separately controlling cooling air for at least two of the one or more pre-fabricated data center modules and the at least one additional pre-fabricated data center module at the site.

20. The method of providing computing resources of claim 17, further comprising shutting down operation of one of the one or more pre-fabricated data center modules in operation at the site in response to a problem condition in the one of the one or more pre-fabricated data center modules while maintaining operation of at least one other of the one or more pre-fabricated data center modules at the site.

* * * * *